United States Patent
Udagawa

(10) Patent No.: US 7,646,040 B2
(45) Date of Patent: Jan. 12, 2010

(54) BORON PHOSPHIDE-BASED COMPOUND SEMICONDUCTOR DEVICE, PRODUCTION METHOD THEREOF AND LIGHT EMITTING DIODE

(75) Inventor: Takashi Udagawa, Chichibu (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 10/535,821

(22) PCT Filed: Nov. 27, 2003

(86) PCT No.: PCT/JP03/15180

§ 371 (c)(1), (2), (4) Date: May 23, 2005

(87) PCT Pub. No.: WO2004/049451

PCT Pub. Date: Jun. 10, 2004

(65) Prior Publication Data

US 2006/0097358 A1     May 11, 2006

Related U.S. Application Data

(60) Provisional application No. 60/430,644, filed on Dec. 4, 2002.

(30) Foreign Application Priority Data

Nov. 28, 2002    (JP)   .............................. 2002-344828

(51) Int. Cl.
    *H01L 33/00*      (2006.01)
    *H01L 29/205*    (2006.01)

(52) U.S. Cl. ............... 257/201; 257/103; 257/E33.025; 257/E29.091; 438/47

(58) Field of Classification Search ................... 257/201
See application file for complete search history.

(56) References Cited

U.S. PATENT DOCUMENTS

| | | | |
|---|---|---|---|
| 3,877,060 A | | 4/1975 | Shono et al. |
| 5,005,057 A | * | 4/1991 | Izumiya et al. ............... 257/13 |
| 5,300,793 A | | 4/1994 | Kondow et al. |
| 2003/0027099 A1 | | 2/2003 | Udagawa |
| 2004/0169184 A1 | | 9/2004 | Udagawa et al. |

FOREIGN PATENT DOCUMENTS

EP     1 032 099 A2     8/2000

(Continued)

OTHER PUBLICATIONS

Izumiya et al, "Growth of BP and GaN/BP heterostructures" Inst. Phys. Conf. Ser. No. 129: Chapter 3, 19th Int. Symp. GaAs and Related Compounds 1992. pp. 157-162.*

(Continued)

*Primary Examiner*—Jerome Jackson, Jr.
(74) *Attorney, Agent, or Firm*—Sughrue Mion, PLLC

(57) ABSTRACT

A boron phosphide-based semiconductor device having a junction structure of a Group-III nitride semiconductor layer and a boron phosphide layer with excellent device properties is provided. The boron phosphide-based compound semiconductor device has a heterojunction structure comprising a Group-III nitride semiconductor layer and a boron phosphide layer, wherein the surface of the Group-III nitride semiconductor layer has (0.0.0.1.) crystal plane, and the boron phosphide layer is a {111}-boron phosphide layer having a {111} crystal plane stacked on the (0.0.0.1.) crystal plane of the Group-III nitride semiconductor layer in parallel to the (0.0.0.1.) crystal plane.

8 Claims, 3 Drawing Sheets

FOREIGN PATENT DOCUMENTS

| | | |
|---|---|---|
| JP | 55-3834 B2 | 1/1980 |
| JP | 05-283744 | 10/1993 |
| JP | 08-264896 | 10/1996 |
| JP | 09-232685 | 9/1997 |
| JP | 10-242514 A | 9/1998 |
| JP | 10-242515 A | 9/1998 |
| JP | 10-242567 A | 9/1998 |
| JP | 10-242568 A | 9/1998 |
| JP | 10-242569 A | 9/1998 |
| JP | 10-247745 A | 9/1998 |
| JP | 10-247760 A | 9/1998 |
| JP | 10-247761 A | 9/1998 |
| JP | 2002-231640 | 8/2002 |
| JP | 2002-232000 | 8/2002 |
| JP | 2002-246643 | 8/2002 |
| JP | 2002-299741 | 10/2002 |
| WO | WO 99/28977 A | 6/1999 |
| WO | WO 03/065465 A2 | 8/2003 |
| WO | WO 2004/047188 A1 | 6/2004 |

OTHER PUBLICATIONS

T. Udagawa, et al, "Lattice-Matched Boronphosphide (BP)/Hexagonal GaN Heterostructure for Inhibition of Dislocation Penetration", Phys.Stat Solidi, No. 7, Oct. 20, 2003, pp. 2027-2030.

Isamu Akasaki, "III Zoku Chikkabutsu Handotai (Group-III Nitride Semiconductor)", (Advanced Electronics 1-21), $1^{st}$ ed., Baifukan Dec. 8, 1999, pp. 285-293, Abstract.

Isamu Akasaki, et al, "Effects of AIN Buffer Layer on Crystallographic Structure and on Electrical and Optical Properties of GaN and Ga1-xAlxN ($0<X\leq0.4$) Films Grown Sapphire Substrate by Movpe", (The Netherlands), Journal of Crystal Growth, vol. 98, 1989, pp. 209-219.

L.T. Romano, et al, "Structural Characterization of Thick GAN Films Grown by Hydride Vapor Phase Epitaxy", (U.S.A), Mat. Res. Soc. Symp. Proc. vol. 23, 1996, pp. 245-250.

Iwao Teramoto, "Handotai Device Gairon", (Introduction to Semiconductor Device), $1^{st}$ ed. Baifukan, Mar. 30, 1995 p. 28.

Izumiya, T., et al., *Growth of BP and GaN/BP heterostructures*, Gallium arsenide and related compounds 1992: proceedings of the Nineteenth International Symposium on Gallium Arsenide and Related Compounds, Karuizawa, Japan, Sep. 28-Oct. 2, 1992, pp. 157-162, vol. 129.

L.T. Romano et al., Structural Characterization of Thick GAN Films Grown by Hydride Vapor Phase Epitaxy, (U.S.A.), Mat. Res. Symp. Proc., 1996, pp. 245-250, vol. 423.

\* cited by examiner

BORON PHOSPHIDE-BASED COMPOUND SEMICONDUCTOR DEVICE, PRODUCTION METHOD THEREOF AND LIGHT EMITTING DIODE

CROSS-REFERENCE TO RELATED APPLICATIONS

This application claims the benefit pursuant to 35 U.S.C. §119(e)(1) of U.S. Provisional Application, No. 60/430,644 filed Dec. 4, 2002.

TECHNICAL FIELD

The present invention relates to a boron phosphide-based semiconductor device having a heterojunction structure composed of a Group-III nitride semiconductor layer and a boron phosphide layer with excellent crystallographic orientation property, and also relates to a production method thereof and a light-emitting diode.

BACKGROUND ART

Conventionally, Group-III nitride semiconductors such as aluminum gallium indium nitride ($Al_XGa_YIn_ZN$: $0 \leq X, Y, Z \leq 1$, $X+Y+Z=1$) have been used, for example, as a light-emitting layer or clad layer of a light-emitting diode (LED), or an electron channel layer or electron supplying layer of a high mobility field effect transistor (TEGFET) (see, for example, Patent Document 1 and Non-Patent Document 1).

A device using the Group-III nitride semiconductor (Group-III nitride semiconductor device) usually has a heterojunction structure of Group-III nitride semiconductors to express the device function. For example, Patent Document 1 discloses an invention where the light-emitting part of LED or laser diode (LD) is constituted with the heterojunction of gallium nitride (GaN) and gallium indium nitride ($Ga_YIn_ZN$: $0 \leq Y$, $Z<1$, $Y+Z=1$).

The Group-III nitride semiconductor layer or hetero-junction structure comprising the Group-III nitride semiconductor layers, constituting a compound semiconductor device, has been heretofore produced by the vapor phase growth method mainly on a sapphire ($\alpha$-$Al_2O_3$ single crystal) substrate.

However, the lattice mismatch, for example, between the sapphire substrate and gallium nitride (GaN) is as large as about 16% (see, for example, Non-Patent Document 2) and the gallium nitride layer formed on a sapphire substrate is known to contain a large amount of misfit dislocations exceeding $1 \times 10^8/cm^2$ (see, for example, Patent Document 3). In the heterojunction structure comprising Group-III nitride semiconductors such as gallium nitride, the misfit dislocation propagates to an upper layer over the part of the heterojunction. Therefore, in conventional techniques, a heterojunction structure reduced in the dislocation density can be hardly obtained.

The present inventors had found that a boron phosphide (BP) layer is effective in inhibiting the propagation of misfit dislocation from the Group-III nitride semiconductor layer.

Patent Documents 2 to 7 disclose a technique of forming a light-emitting device by joining a boron phosphide layer on a Group-III nitride semiconductor layer comprising hexagonal wurtzite gallium nitride or the like. However, in these conventional techniques, inhibition of the propagation of misfit dislocation from the Group-III nitride semiconductor layer is not intended (see, Patent Documents 8 and 9). A crystalline structure for the boron phosphide layer effective in satisfactorily and stably inhibiting the propagation of misfit dislocation from a Group-III nitride semiconductor layer is not yet known. Therefore, a pn-junction structure of a Group-III nitride semiconductor layer and a boron phosphide layer, which is reduced in the leakage current and can express good rectification property, is heretofore difficult to stably obtain.

(Patent Document 1)
JP-B-55-3834 (the term "JP-B" as used herein means an "examined Japanese patent publication")
(Patent Document 2)
JP-A-10-242514 (the term "JP-A" as used herein means an "unexamined published Japanese patent application")
(Patent Document 3)
JP-A-10-242515
(Patent Document 4)
JP-A-10-242567
(Patent Document 5)
JP-A-10-242568
(Patent Document 6)
JP-A-10-242569
(Patent Document 7)
JP-A-10-247745
(Patent Document 8)
JP-A-10-247760
(Patent Document 9)
JP-A-10-247761
(Non-Patent Document 1)
Isamu Akasaki (compiler), III Zoku Chikkabutsu Handotai (Group-III Nitride Semiconductor) (Advanced Electronics 1-21), 1st ed., pp. 285-293, Baifukan (Dec. 8, 1999)
(Non-Patent Document 2)
Isamu Akasaki et al., "EFFECTS OF AlN BUFFER LAYER ON CRYSTALLOGRAPHIC STRUCTURE AND ON ELECTRICAL AND OPTICAL PROPERTIES OF GaN AND Ga1-xAlxN (0<X≦0.4) FILMS GROWN ON SAPPHIRE SUBSTRATE BY MOVPE", (the Netherlands), *Journal of Crystal Growth*, Vol. 98, pp. 209-219 (1989)
(Non-Patent Document 3)
L. T. Romana et al., "STRUCTURAL CHARACTERIZATION OF THICK GaN FILMS GROWN BY HYDRIDE VAPOR PHASE EPITAXY", (U.S.A.), *Mat. Res. Soc. Symp. Proc.*, Vol. 423, pp. 245-250 (1996)

DISCLOSURE OF INVENTION

The present invention has been made under these circumstances and an object of the present invention is to clarify the crystalline feature of a boron phosphide layer capable of satisfactorily and stably inhibiting the propagation of misfit dislocation from a Group-III nitride semiconductor layer and thereby provide a boron phosphide-based semiconductor device having a junction structure of a Group-III nitride semiconductor layer and a boron phosphide layer and accompanied with excellent device properties. Another object of the present invention is to provide a production method thereof.

As a result of investigations to attain the above-described objects, the present inventors have invented the following boron phosphide-based compound semiconductor device, a production method thereof and a light-emitting diode.

That is, the present invention provides:

(1) a boron phosphide-based compound semiconductor device having a heterojunction structure comprising a Group-III nitride semiconductor layer and a boron phosphide layer, wherein the surface of the Group-III nitride semiconductor layer has (0.0.0.1.) crystal plane and the boron phosphide layer is a {111}-boron phosphide layer having a {111} crystal plane stacked on the (0.0.0.1.) crystal plane of the Group-III nitride semiconductor layer in parallel to the (0.0.0.1.) crystal plane;

(2) the boron phosphide-based compound semiconductor device as described in (1), wherein the Group-III nitride semiconductor layer is wurtzite crystal type and the [2.−1.−1.0.] crystal azimuth of the (0.0.0.1.) crystal plane of the Group-III nitride semiconductor layer orients in parallel to the <110> crystal azimuth of the {111} crystal plane of the boron phosphide layer;

(3) the boron phosphide-based compound semiconductor device as described in (2), wherein the <110> crystal azimuths of the boron phosphide layer running in parallel with the [2.−1.−1.0.] crystal azimuth of the (0.0.0.1.) crystal plane of the Group-III nitride semiconductor layer are present in two directions and the angle made by these azimuths is 180°;

(4) the boron phosphide-based compound semiconductor device as described in (3), wherein the <110> crystal azimuths of the boron phosphide layer running in parallel to the [2.−1.1.0.] crystal azimuth of the (0.0.0.1.) crystal plane of the Group-III nitride semiconductor layer are [1.−1.0.] and [−1.1.0.];

(5) the boron phosphide-based compound semiconductor device as described in any one of (1) to (4), wherein the boron phosphide layer is a {111}-boron phosphide layer containing at least one of stacking fault and twin on the <111> crystal azimuth; and (6) the boron phosphide-based compound semiconductor device as described in any one of (1) to (5), wherein the boron phosphide layer has a dislocation density lower than the Group-III nitride semiconductor layer.

The present invention also provides:

(7) a method for producing a boron phosphide-based compound semiconductor device having a heterojunction structure comprising a Group-III nitride semiconductor layer and a boron phosphide layer, the method using, as a substrate, a Group-III nitride semiconductor layer having a surface of (0.0.0.1.) crystal plane and comprising a step of supplying a boron-containing compound and a phosphorus-containing compound to a vapor phase growth region to vapor-grow a {111}-boron phosphide layer having a {111} crystal plane stacked in parallel to the (0.0.0.1.) crystal plane of the Group-III nitride semiconductor layer;

(8) the method for producing a boron phosphide-based compound semiconductor device as described in (7), wherein the boron phosphide layer is vapor-grown at a temperature of 750° C. to 1,200° C.; and (9) the method for producing a boron-phosphide-based compound semiconductor device as described in (7) or (8), wherein the boron phosphide layer is vapor-grown at a V/III ratio of 600 or more.

The "V/III ratio" as used in the present invention means a ratio of the concentration of phosphorus atom in the phosphorus-containing compound (phosphorus source material) to the concentration of boron atom in the boron-containing compound (boron source material) supplied to the vapor phase growth region.

Furthermore, the present invention provides:

(10) a light-emitting diode comprising a stacked structure obtained by sequentially stacking a lower clad layer, a light-emitting layer, a protective layer for protecting the light-emitting layer, and an upper clad layer, wherein the protective layer is composed of a Group-III nitride semiconductor layer having a surface of (0.0.0.1.) crystal plane and the upper clad layer is composed of a {111}-boron phosphide layer having a {111} crystal plane stacked on the (0.0.0.1.) crystal plane of the protective layer.

THE BEST MODE FOR CARRYING OUT THE INVENTION

The present invention is described in detail below.

Boron Phosphide-Based Compound Semiconductor Device

The boron phosphide-based compound semiconductor device of the present invention has a heterojunction structure comprising a Group-III nitride semiconductor layer and a boron phosphide layer and this device is characterized by the crystalline feature of the Group-III nitride semiconductor layer and boron phosphide layer.

The Group-III nitride semiconductor layer working out to the substrate of the boron phosphide layer is suitably a compound represented by the compositional formula: $Al_XGa_YIn_ZN$ ($0 \leq X, Y, Z \leq 1$, $X+Y+Z=1$), such as gallium nitride (GaN) and aluminum gallium nitride ($Al_XGa_{1-X}N$: $0 \leq X \leq 1$). A compound containing other Group-V element (e.g., phosphorus (P), arsenic (As)) in addition to nitrogen (N), for example, a compound represented by the compositional formula: $Al_XGa_YIn_ZN_QM_{1-Q}$ ($0 \leq X, Y, Z \leq 1$, $X+Y+Z=1$, $0<Q \leq 1$, M is a Group-V element other than nitrogen), is also suitably used.

In the boron phosphide-based compound semiconductor device of the present invention, the surface of the Group-III compound semiconductor layer is (0.0.0.1.) crystal plane, and a boron phosphide layer is joined on this crystal plane. Furthermore, in the present invention, the boron phosphide layer is a {111}-boron phosphide layer having a {111} crystal plane stacked in parallel to the (0.0.0.1.) crystal plane of the Group-III nitride semiconductor layer. By employing such a constitution, a superior quality boron phosphide layer reduced in misfit dislocation and the like can be obtained.

This is because the spacing between {110} crystal lattice planes (lattice spacing) almost agrees with the a-axis lattice constant of the (0.0.0.1.) crystal plane of the group-III nitride semiconductor and therefore, a superior quality {111}-boron phosphide layer reduced in the misfit dislocation ascribable to the lattice mismatching can be formed on the {0.0.0.1.} crystal plane of the Group-III nitride semiconductor layer.

For example, the lattice spacing of boron monophosphide crystal is 0.320 nm, whereas the a-axis lattice constant of gallium nitride (GaN) is 0.318 nm and the a-axis lattice constant of aluminum nitride (AlN) is 0.311 nm (as for the a-axis lattice constants, see, Iwao Teramoto, *Handotai Device Gairon (Introduction to Semiconductor Device)*, 1st ed., page 28, Baifukan (Mar. 30, 1995)). Thus, in the case of GaN, almost no lattice mismatch is present between the a-axis lattice constant of the (0.0.0.1.) crystal plane of the Group-III nitride semiconductor and the lattice spacing on the {110} crystal plane of boron phosphide, and even in the case of AlN, the lattice mismatch is at most only 2.8%. Therefore, a superior quality boron phosphide layer can be grown on the (0.0.0.1.) crystal plane of the Group-III nitride semiconductor.

Figure 1:
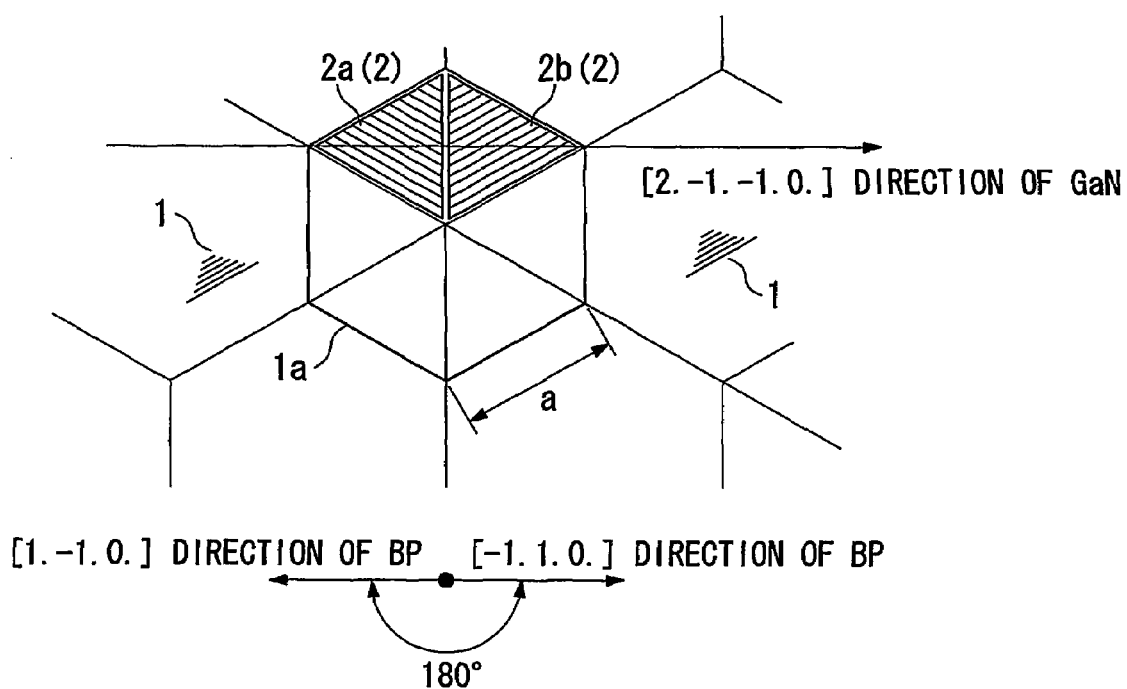
FIG. 1 is a schematic view showing the orientation situation of {111}-boron phosphide crystal on the (0.0.0.1.) crystal surface of wurtzite crystal type gallium nitride single crystal.

Based on FIG. 1, the present invention is specifically described by referring to the case where the Group-III nitride semiconductor layer comprises a wurtzite gallium nitride single crystal. FIG. 1 is a plan view schematically showing the (0.0.0.1.) crystal plane of a wurtzite gallium nitride single crystal and the orientation situation of boron phosphide crystal formed thereon.

The (0.0.0.1.) crystal plane 1 of the gallium nitride single crystal is constituted by a large number of densely configured planar equilateral hexagonal unit cells (unit planar crystal lattices) 1a. In the present invention, on the crystal plane 1, {111} crystallites 2 (2a and 2b) of boron phosphide are stacked in parallel to the crystal plane 1 to bring out good lattice matching between gallium nitride and boron phosphide.

The best lattice matching is attained between gallium nitride and boron phosphide when the {111} crystal plane of boron phosphide is disposed such that the <110> crystal azimuth of the {111} crystal plane of boron phosphide runs in parallel with the [2.-1.-1.0] crystal azimuth of the (0.0.0.1.) crystal plane 1 of gallium nitride. This is because the a-axis lattice constant (shown by a in FIG. 1) of the (0.0.0.1.) crystal plane 1 of gallium nitride almost agrees with the spacing between {110} lattice planes of the {111} crystal plane of boron phosphide.

Particularly, when planar equilateral triangular {111}-crystallites 2a and 2b of boron phosphide are disposed such that the [1.-1.0.] or [-1.1.0.] crystal azimuth of boron phosphide runs in parallel to the [2.-1.-1.0.] crystal azimuth of gallium nitride, a {111}-boron phosphide layer having excellent quality can be obtained. Here, the [1.-1.0.] crystal azimuth and the [-1.1.0.] crystal azimuth have different directions making an angle of 180°. In FIG. 1, the boron phosphide crystallite 2a has a relationship that the [2.-1.-1.0.] crystal azimuth of boron nitride runs in parallel to the [1.-1.0.] crystal azimuth, and the boron phosphide crystallite 2b has a relationship that the [2.-1.-1.0.] crystal azimuth of boron nitride runs in parallel to the [-1.1.0.] crystal azimuth. By coalescence of {111}-crystallites 2a and 2b with respective apexes differing in the direction by 180°, a {111}-boron phosphide crystal layer matching with the (0.0.0.1.) crystal plane of gallium nitride and, as a whole, having a planar equilateral hexagonal shape can be constituted.

Production Method of Boron Phosphide-Based Compound Semiconductor Device

The above-described boron phosphide-based compound semiconductor device of the present invention can be produced, for example, by using the Group-III nitride semiconductor layer as the substrate, supplying a boron-containing compound and a phosphorus-containing compound to the vapor phase growth region, and growing a boron phosphide layer by a vapor phase growth method under specific conditions. Examples of the vapor phase growth method include metal-organic vapor phase epitaxy (MOVPE), halogen VPE, halide VPE and molecular beam epitaxy (MBE).

In order to obtain a {111} boron phosphide crystal layer comprising many planar equilateral triangular {111} crystallites regularly and orderly oriented to agree with the shape of a planar equilateral hexagonal unit cell constituting the (0.0.0.1.) crystal plane of the above-described hexagonal Group-III nitride semiconductor crystal, it is preferred to satisfy the following conditions (A) to (G).

(A) In vapor growth of the {111}-boron phosphide crystal layer, the surface of the Group-III nitride semiconductor layer (for example, gallium nitride crystal layer) as the substrate needs to be a single crystal comprising a (0.0.0.1.) crystal plane.

(B) The tilt angle of the (0.0.0.1.) single crystal surface of the Group-III nitride semiconductor layer is preferably within ±5° with respect to the horizontal surface assigned to the (0.0.0.1.) crystal plane. If the single crystal surface is tilted from the (0.0.0.1.) crystal plane at an angle exceeding 5°, the difference in the spacing between the arrangement of atom constituting the crystal and the {110} lattice plane of {111}-boron phosphide crystal increases and therefore, a {111}-boron phosphide crystal layer where planar equilateral triangular {111}-boron phosphide crystallites are orderly and regularly oriented as shown in FIG. 1 cannot be stably formed.

(C) The surface of the Group-III nitride semiconductor layer is preferably maintained to a stoichiometrically almost balanced composition so as to bring out effective function as a substrate on which the boron phosphide crystal layer is vapor-grown. For example, when the Group-III nitride semiconductor layer is kept at a high temperature at the time of vapor growth of a boron phosphide crystal layer, the Group-V element constituting the Group-III nitride semiconductor layer is evaporated and the Group-III element becomes rich as compared with the Group-V element on the surface of the Group-III nitride semiconductor layer. In such a case, for maintaining a stoichiometrically almost balanced (0.0.0.1.) crystal surface, the temperature of the Group-III nitride semiconductor layer is preferably elevated, for example, in an atmosphere excessively including a nitrogen-containing compound such as ammonia ($NH_3$) or hydrazine ($N_2H_2$).

(D) The boron phosphide layer is preferably vapor-grown at a temperature of 750 to 1,200° C. If the layer formation temperature (temperature of the substrate) is less than 750° C., the {111} single crystal layer of boron phosphide cannot be stably obtained, whereas if it exceeds 1,200° C., a polyhedral boron phosphide such as $B_{13}P_2$ is generated and a boron monophosphide cannot be stably obtained. In the case of obtaining an n-type {111}-boron phosphide crystal layer, the layer formation temperature is preferably from 750° C. to about 1,000° C., and in the case of obtaining a p-type {111}-boron phosphide crystal layer, the layer formation temperature is preferably from about 1,000° C. to 1,200° C.

(E) At the time of vapor growth of the boron phosphide crystal layer, the V/III ratio is preferably 600 or more, more preferably from 1,000 to 2,000.

(F) In advance of the vapor growth of boron phosphide crystal layer, gaseous source materials (boron-containing compound and phosphorus-containing compound) are preferably passed into the vapor-phase growth region to previously form a film containing phosphorus and boron on the surface of a site which comes into contact with the source material gases in the vapor phase growth region. The thickness of the film is not particularly limited but a thickness of about 100 nm is sufficient.

(G) At the vapor-growth of the boron phosphide layer, the boron-containing compound and phosphorus-containing compound as the gaseous source materials are preferably controlled to timewise simultaneously reach the surface of the Group-III nitride semiconductor layer placed in the vapor phase growth region. The arrival time of the source material gases to the Group-III nitride semiconductor layer can be controlled by the flow rate of carrier gas. The "carrier gas" is a gas having a role of carrying-the-source material gases to the vapor phase growth region and this gas can be constituted by high-purity hydrogen ($H_2$) or an inert gas such as nitrogen ($N_2$) and argon (Ar), or a mixed gas containing such a gas. The allowable difference in the arrival time between source material gases is, for example, about 5 seconds when a {111}-boron phosphide crystal layer is vapor-grown at a growth rate of 50 nm/min. In the case where the arrival times are almost equal but slightly different, the flow rate of carrier gas is preferably adjusted such that the source material gas of Group-V element (phosphorus-containing compound) having high volatility reaches to the surface of the Group-III nitride semiconductor layer timewise earlier than the source material gas of Group-III element (boron-containing compound), whereby the formation of a {111}-boron phosphide crystal layer is advantageously more facilitated.

Whether or not an oriented {111}-boron phosphide crystal layer is formed on the (0.0.0.1.) crystal plane of the Group-III nitride semiconductor layer can be known from a diffraction pattern of X-ray diffraction or electron diffraction.

In the case where a {111}-boron phosphide crystal layer is grown on the (0.0.0.1.) crystal plane of the Group-III nitride semiconductor layer, particularly, when the {111}-boron phosphide layer is a thin layer having a thickness of less than about 500 nm, Bragg diffraction peaks originated in the (0.0.0.1.) crystal plane of the Group-III nitride semiconductor crystal and in the {111} crystal plane of the boron phosphide clearly appear in the X-ray diffraction pattern.

In the case of an electron diffraction pattern, diffraction spots originated from the {111} crystal plane of the boron phosphide crystal layer appear on the straight line connecting the diffraction spots originated from the (0.0.0.1.) crystal plane of the Group-III nitride semiconductor layer. Furthermore, when the direction of incident electron beam is made in the <110> direction, a 180°-inverted reciprocal lattice image of {110} crystal planes is obtained from {111}-boron phosphide crystals differing in the apex direction by an angle of 180°, namely, {111}-boron phosphide crystals oriented symmetrically about the <110> crystal axis as the center.

In the boron phosphide-based compound semiconductor device of the present invention, a boron phosphide crystal layer is vapor-grown using the (0.0.0.1.) crystal plane of the Group-III nitride semiconductor layer as the substrate to provide a regularly and orderly oriented {111}-boron phosphide crystal layer, so that the effect of preventing the propagation of dislocation from the substrate can be stably exerted in a high level. As a result, a boron phosphide-based semiconductor device where the boron phosphide crystal layer has a dislocation density lower than the Group-III nitride semiconductor layer can be provided.

In particular, the crystallographic configuration that the [2.−1.−1.0.] crystal azimuth of the (0.0.0.1.) crystal plane of the Group-III nitride semiconductor layer runs in parallel to the <110> crystal azimuth of the boron phosphide crystal layer is advantageous, because a {111}-boron phosphide crystal layer well matching to the (0.0.0.1.) crystal plane of the Group-III nitride semiconductor layer can be stably obtained.

For example, the {111}-boron phosphide crystal layer provided on the (0.0.0.1.) crystal plane of gallium nitride stops the propagation of dislocation from gallium nitride at the junction interface between two layers and the boron phosphide layer itself becomes a crystal layer having a low dislocation density of $1 \times 10^3/cm^2$ or less. In the inside of such a boron phosphide crystal layer having a low dislocation density, at least one of stacking fault and twin is contained along the <111> crystal azimuth of boron phosphide. It is presumed that the stacking fault or twin absorbs the dislocation, as a result, the dislocation density decreases.

As described in the foregoing pages, according to the present invention, the propagation of dislocation from the substrate can be satisfactorily and stably prevented by the boron phosphide crystal layer, so that a boron phosphide-based compound semiconductor device capable of expressing good rectification properties with less leakage current and having excellent device properties can be provided.

In the boron phosphide-based compound semiconductor device of the present invention, the {111}-boron phosphide crystal layer having the above-described properties can be effectively used as a functional layer capable of preventing the device driving current from short-circuiting through the dislocation. For example, the {111}-boron phosphide crystal layer having a low dislocation density, which is hetero-joined with the Group-III nitride semiconductor layer, can be used as a contact layer for forming an ohmic electrode free from breakdown due to short-circuiting and also used as a contact layer for forming a Schottky junction-type gate electrode prevented from short-circuit leakage of gate current.

The present invention is described below by referring to Examples.

EXAMPLE

Figure 2:
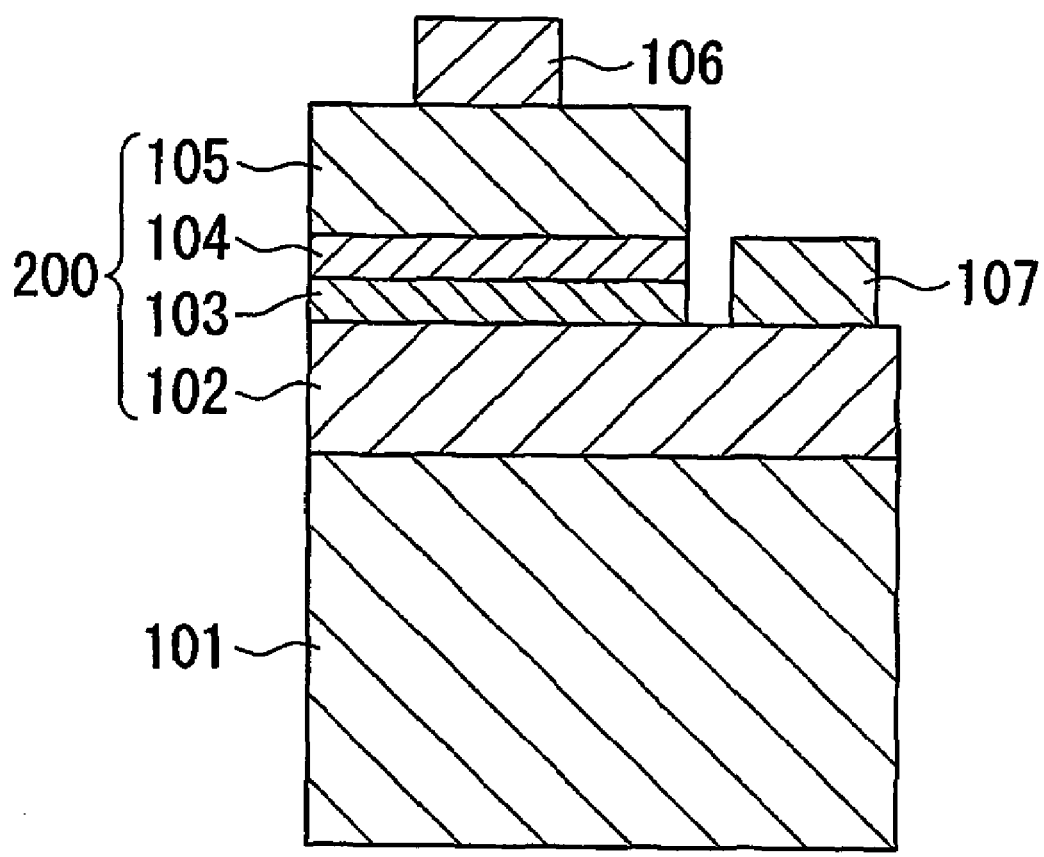
FIG. 2 is a schematic view showing the cross-sectional structure of the pn-junction type LED produced in Example of the present invention.

As the boron phosphide-based compound semiconductor device of the present invention, a light-emitting diode having a pn-junction type double hetero (DH) junction structure was produced by vapor growth of a {111}-boron phosphide crystal layer on the surface of a (0.0.0.1.)-gallium nitride single crystal layer deposited on a sapphire substrate. FIG. 2 schematically shows the cross-sectional structure of LED produced.

First, on the surface of a sapphire substrate 101 having a surface of (0.0.0.1.) crystal plane, a lower clad layer 102 composed of an n-type (0.0.0.1.)-gallium nitride (GaN) single crystal layer was formed at 1,050° C. by an atmospheric pressure (nearly atmospheric pressure) MOCVD method using a trimethyl gallium (($CH_3)_3$Ga)/ammonia ($NH_3$)/hydrogen ($H_2$) reaction system. The carrier concentration of the n-type gallium nitride crystal layer constituting the lower clad layer 102 was about $2 \times 10^{18}$ $cm^{-3}$ and the layer thickness was 3 μm.

On the (0.0.0.1.) crystal surface of the lower clad layer 102, a light-emitting layer 103 composed of an n-type (0.0.0.1.)-gallium indium nitride ($Ga_{0.90}In_{0.10}N$) was vapor-grown at 850° C. by an atmospheric pressure (nearly atmospheric pressure) MOCVD method using a ($CH_3)_3$Ga/trimethyl indium (($CH_3)_3$In)/$NH_3$/$H_2$ reaction system. The carrier concentration of the n-type gallium indium nitride mixed crystal layer constituting the light-emitting layer 103 was about $8 \times 10^{17}$ $cm^{-3}$ and the layer thickness was about 50 nm.

The supply of indium source material (($CH_3)_3$In) to the vapor phase growth region was stopped to finish the growth of the light-emitting layer 103. Thereafter, ($CH_3)_3$Ga and $NH_3$ were continuously flowed to the vapor phase growth region together with a carrier gas $H_2$, whereby a protective layer 104 composed of an undoped and high-resistive (0.0.0.1.)-gallium nitride layer was subsequently formed on the light-emitting layer 103. The protective layer 104 was a layer for preventing the reduction in the emission intensity of the light-emitting layer 103. The carrier concentration of the protective layer 104 was about $5 \times 10^{17}$ $cm^{-3}$ or less and the layer thickness was about 12 μm.

After the completion of vapor phase growth of the protective layer 104, lowering of the temperature was started. Until the temperature was lowered to 600° C., ammonia was continuously flowed to the vapor phase growth region so as to prevent the vaporization of nitrogen from the (0.0.0.1.) crystal surface of the protective layer 104 and maintain the stoichiometric composition of the protective layer 104.

After cooling to room temperature, the stacked structure where the lower clad layer 102, the light-emitting layer 103 and the protective layer 104 were sequentially stacked on the substrate 101 was sheltered from the vapor phase growth region into a chamber capable of avoiding contact with the source material gases. During the formation of stacked structure, a hydrogen gas was flowed in the chamber.

While the stacked structure was sheltered as above, a hydrogen gas accompanied with vapor of triethylboran $((C_2H_5)_3B)$, and phosphine $(PH_3)$ were flowed to the vapor phase growth region to form a film containing boron and phosphorus on the inner wall and the like of a quartz-made growth furnace in the vapor phase growth region. After the film was deposited at 1,100° C. to a thickness of about 1 μm, the temperature of the vapor phase growth region was lowered to a temperature near room temperature while flowing a hydrogen gas.

Subsequently, the stacked structure sheltered was again returned to the vapor phase growth region and in a mixed atmosphere of ammonia $(NH_3)$ and hydrogen $(H_2)$, the temperature was elevated from room temperature to 1,025° C. After the elevation of temperature, the supply of $NH_3$ to the vapor phase growth region was stopped and at the same time, phosphine $(PH_3)$ as a phosphorus source material and triethylboran $((C_2H_5)_3B)$ as a boron source material were simultaneously flowed to the vapor phase growth region. The flow rate of a hydrogen carrier gas carrying $PH_3$ was adjusted to 9 L/min and the flow rate of a hydrogen carrier gas carrying $(C_2H_5)_3B$ vapor was adjusted to 7 L/min, so that the phosphorus source material and the boron source material could simultaneously arrive the (0.0.0.1.) crystal plane of the protective layer 104. By this, an upper clad layer 105 composed of an undoped p-type boron phosphide layer was joined and formed on the (0.0.0.1.)-gallium nitride (GaN) crystal surface of the protective layer 104 by a normal pressure MOCVD method using a $(C_2H_5)_3B/PH_3/H_2$ reaction system. At the time of growth of the upper clad layer 105 (boron phosphide layer), the V/III ratio (=concentration ratio $PH_3/(C_2H_5)_3B$) was set to 1,000. The carrier concentration of the upper clad layer 105 (boron phosphide layer) was $2 \times 10^9$ cm$^{-3}$ and the layer thickness was 500 nm.

In this way, a stacked structure 200 where the lower clad layer 102, the light-emitting layer 103, the protective layer 104 and the upper clad layer 105 were sequentially stacked on the substrate 101 was obtained.

The cross section of a thinned stacked structure 200 was observed by TEM to examine the crystal structure of boron phosphide layer constituting the upper clad layer 105. As a result, twin (or stacking fault) was found to be present in the inside along the direction at an angle of 70° with respect to the (0.0.0.1.) crystal surface of the protective layer, namely, <111> crystal azimuth of boron phosphide.

Figure 3:
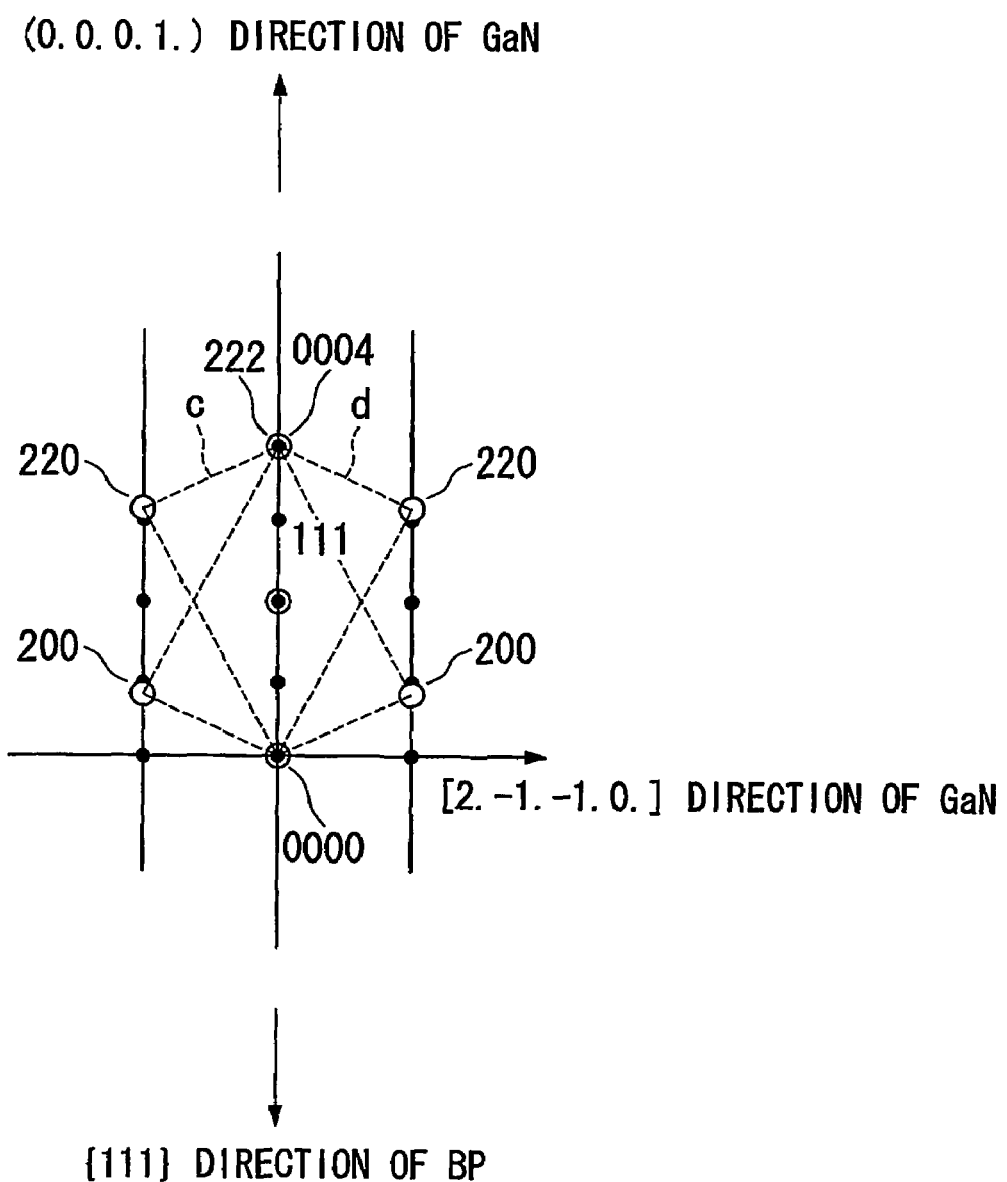
FIG. 3. is a copied electron diffraction pattern from (0.0.0.1.)-gallium nitride/{111}-boron phosphide junction structure of the stacked structure obtained in Example of the present invention.

FIG. 3 shows a copied electron diffraction pattern from the gallium nitride layer constituting the protective layer 104 and the boron phosphide layer constituting the upper clad layer 105. In FIG. 3, diffraction points from the boron phosphide crystal are shown by a symbol ○, and diffraction points from gallium nitride are shown by a symbol ●. The portion where these symbols are overlapped reveals that diffraction points from the both crystals appear at the same position.

As shown in the Figure, the direction in which diffraction related to the (0.0.0.1.) crystal plane of gallium nitride appears and the direction in which diffraction related to the {111} crystal plane of boron phosphide appear run in parallel and it was confirmed that the {111}-crystal plane of boron phosphide was stacked on the (0.0.0.1.) crystal plane of gallium nitride.

When the direction of incident electron beam was made to the [2.-1.-1.0.] crystal azimuth of gallium nitride, reciprocal lattice images of zinc-blende crystal type boron phosphide seen from the <110> crystal direction of boron phosphide appeared. From this, it was revealed that the [2.-1.-1.0.] crystal azimuth of (0.0.0.1.) of gallium nitride and the <110> crystal azimuth of boron phosphide are in parallel.

Furthermore, the reciprocal lattice images (rectangles c and d shown with broken lines in FIG. 3) seen from the <110> crystal azimuth of boron phosphide appeared at positions 180°-rotated with each other and this reveals that the {111}-boron phosphide layer was composed of {111}-boron phosphide crystals differing in the direction by 180°.

The dislocation density of the upper clad layer 105 composed of a boron phosphide layer was less than $1 \times 10^3$ cm$^{-3}$. This is because the dislocation generated due to lattice mismatch with the sapphire substrate 101 and propagated from the inside of the lower clad layer 102 composed of an n-type gallium nitride layer through the light-emitting layer 103 and the protective layer 104 was blocked at the junction interface between the upper clad layer 105 composed of a boron phosphide layer and the protective layer 104.

After these evaluations, a planar circular p-type ohmic electrode 106 composed of a gold-beryllium alloy (Au: 99 mass %, Be: 1 mass %) and having a diameter of 130 μm was disposed in the center on the surface of the upper clad layer 105. On the other hand, the upper clad layer 105, the protective layer 104 and the light-emitting layer 103 each was partially removed to expose the lower clad layer 102 composed of an n-type gallium nitride layer and on this exposed surface, an n-type ohmic electrode 107 was disposed. The n-type ohmic electrode 107 was constituted by a two-layer stacked structure electrode consisting of a titanium (Ti) lower layer and an aluminum (Al) upper layer.

In this way, an LED having a planar square shape with one side of about 300 μm and having a pn-junction type DH structure was produced. When an operating current of 20 mA was passed in the forward direction between p-type and n-type ohmic electrodes 106 and 107, the LED exhibited the following light emission properties.

(1) Emission color: bluish violet
(2) Emission center wavelength: about 430 nm
(3) Brightness (as chip state): about 7 mcd
(4) Forward voltage: about 3.6 V Incidentally, when a current of 10 μA was passed in the reverse direction between the p-type and n-type ohmic electrodes 106 and 107, the reverse voltage was 10 V.

In this Example, the upper clad layer 105 was constituted from a low-resistive p-type {111}-boron phosphide layer regularly and orderly oriented on the (0.0.0.1.)-gallium nitride crystal surface constituting the protective layer 104, so that the device operating current could be diffused over a wide region of the light-emitting layer 103. Also, local breakdown through {111}-dislocation having a low dislocation density was scarcely generated. Therefore, sparse generation of emission and luminescent spots due to short-circuit flow of the device operating current through dislocation did not occur and from a near-field emission pattern, it was confirmed that emission with homogeneous intensity was given from almost the entire surface of the light-emitting layer 103. Thus, in this Example, a short-wavelength visible light-emitting diode ensured with high breakdown characteristic, homogeneous emission intensity and excellent device properties could be obtained.

INDUSTRIAL APPLICABILITY

As described in detail above, according to the present invention, a boron phosphide-based compound semiconductor device satisfactorily and stably prevented from the propagation of misfit dislocation from the Group-III nitride semiconductor layer and having excellent device properties can be provided.

The invention claimed is:

1. A boron phosphide-based compound semiconductor device having a heterojunction structure comprising a Group-III nitride semiconductor layer having a (0.0.0.1.) crystal plane and a boron phosphide layer,
   wherein the surface of the Group-III nitride semiconductor layer has a crystal plane inclined at an angle that is within ±5° with respect to the (0.0.0.1.) crystal plane of the Group-III nitride semiconductor layer,
   the boron phosphide layer is a zinc-blende crystal type having a {111} crystal plane directly stacked on the (0.0.0.1.) crystal plane of the Group-III nitride semiconductor layer in parallel to the (0.0.0.1.) crystal plane,
   the Group-III nitride semiconductor layer is wurtzite crystal type, and
   the [2.−1.−1.0.] crystal azimuth of the (0.0.0.1.) crystal plane of the Group-III nitride semiconductor layer orients in parallel to the <110> crystal azimuth of the {111} crystal plane of the boron phosphide layer.

2. The boron phosphide-based compound semiconductor device according to claim 1, wherein the <110> crystal azimuths of the boron phosphide layer running in parallel with the [2.−1.−1.0.] crystal azimuth of the (0.0.0.1.) crystal plane of the Group-III nitride semiconductor layer are present in two directions and the angle made by these azimuths is 180°.

3. The boron phosphide-based compound semiconductor device according to claim 2, wherein the <110> crystal azimuths of the boron phosphide layer running in parallel to the [2.−1.−1.0.] crystal azimuth of the (0.0.0.1.) crystal plane of the Group-III nitride semiconductor layer are [1.−1.0.] and [−1.1.0.].

4. The boron phosphide-based compound semiconductor device according to claim 1, wherein the boron phosphide layer is a {111}-boron phosphide layer containing at least one of stacking fault and twin on the <111> crystal azimuth.

5. The boron phosphide-based compound semiconductor device according to claim 1, wherein the boron phosphide layer has a dislocation density lower than the Group-III nitride semiconductor layer.

6. A method for producing a boron phosphide-based compound semiconductor device as claimed in claim 1 having a heterojunction structure comprising a Group-III nitride semiconductor layer and a boron phosphide layer,
   the method using, as a substrate, a Group-III nitride semiconductor layer having a surface of (0.0.0.1.) crystal plane and comprising a step of supplying a boron-containing compound and a phosphorus-containing compound to a vapor phase growth region to vapor-grow a {111}-boron phosphide layer having a {111} crystal plane stacked in parallel to the (0.0.0.1.) crystal plane of the Group-III nitride semiconductor layer.

7. The method for producing a boron phosphide-based compound semiconductor device according to claim 6, wherein the boron phosphide layer is vapor-grown at a temperature of 750° C. to 1,200° C.

8. The method for producing a boron-phosphide-based compound semiconductor device according to claim 6, wherein the boron phosphide layer is vapor-grown at a V/III ratio of 600 or more.

* * * * *